US012738912B2

(12) United States Patent
Kim et al.

(10) Patent No.: US 12,738,912 B2
(45) Date of Patent: Sep. 15, 2026

(54) APPARATUS AND METHOD FOR AMPLIFYING TRANSMISSION/RECEPTION SIGNAL AND CONTROLLING PHASE OF TRANSMISSION/RECEPTION SIGNAL IN WIRELESS COMMUNICATION SYSTEM

(71) Applicant: SAMSUNG ELECTRONICS CO., LTD., Suwon-si (KR)

(72) Inventors: Jinhyun Kim, Suwon-si (KR); Hyunchul Park, Suwon-si (KR); Kihyun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/210,433

(22) Filed: Jun. 15, 2023

(65) Prior Publication Data

US 2023/0327626 A1 Oct. 12, 2023

Related U.S. Application Data

(63) Continuation of application No. PCT/KR2021/018970, filed on Dec. 14, 2021.

(30) Foreign Application Priority Data

Dec. 15, 2020 (KR) ........................ 10-2020-0175742

(51) Int. Cl.
*H03G 3/30* (2006.01)
*H03F 1/14* (2006.01)
(Continued)

(52) U.S. Cl.
CPC ................................. *H03G 3/3036* (2013.01)

(58) Field of Classification Search
None
See application file for complete search history.

(56) References Cited

U.S. PATENT DOCUMENTS 7,358,816 B2 * 4/2008 Ryu .................... H03F 3/45188 330/296
7,560,990 B2 * 7/2009 Lin ...................... H03G 1/0088 330/296

(Continued)

FOREIGN PATENT DOCUMENTS

GB 2506498 A * 4/2014 ............. H03F 3/245
JP 2010-136039 A 6/2010

(Continued)

OTHER PUBLICATIONS

Office Action dated Jun. 24, 2025, issued by Korean Patent Office in Korean Patent Application No. 10-2020-0175742.

(Continued)

*Primary Examiner* — Pablo N Tran
(74) *Attorney, Agent, or Firm* — Sughrue Mion, PLLC

(57) ABSTRACT

The present disclosure relates to a 5$^{th}$ generation (5G) or pre-5G communication system for supporting higher data transmission rates than 4$^{th}$ generation (4G) communication systems such as long-term evolution (LTE). In a wireless communication system, an apparatus comprises: a first amplifier unit that has a common source structure, includes cross-coupled capacitors, and amplifies an input signal; and a second amplifier unit that has a common gate structure, is connected to the first amplifier unit, and amplifies the signal output from the first amplifier unit, wherein the second amplifier unit includes a first input unit, a second input unit, a third input unit, and a fourth input unit, and two input units among the first input unit, the second input unit, the third input unit, and the fourth input unit may be connected to the first amplifier unit.

20 Claims, 15 Drawing Sheets

(51) Int. Cl.

| | |
|---|---|
| ***H03G 3/10*** | (2006.01) |
| ***H04B 1/10*** | (2006.01) |
| ***H04B 1/26*** | (2006.01) |

(56) References Cited

U.S. PATENT DOCUMENTS

| | | | | |
|---|---|---|---|---|
| 7,679,436 | B2 * | 3/2010 | Jimenez | H03F 3/189 330/253 |
| 7,756,491 | B2 | 7/2010 | Kee et al. | |
| 8,112,056 | B2 * | 2/2012 | Safarian | H04B 1/18 455/325 |
| 8,514,021 | B2 * | 8/2013 | Heikkinen | H03F 3/211 330/307 |
| 8,687,968 | B2 | 4/2014 | Nosaka et al. | |
| 8,786,346 | B2 | 7/2014 | Yanagisawa | |
| 9,602,054 | B2 | 3/2017 | Chakraborty | |
| 9,871,491 | B2 | 1/2018 | Darwish | |
| 10,128,817 | B2 | 11/2018 | Qian et al. | |
| 10,209,735 | B1 * | 2/2019 | Lin | G06F 1/06 |
| 10,826,442 | B2 | 11/2020 | Yoo et al. | |
| 11,979,119 | B2 * | 5/2024 | Park | H03F 3/193 |
| 2006/0097792 | A1 | 5/2006 | Ryu et al. | |
| 2011/0150495 | A1 | 6/2011 | Nosaka et al. | |
| 2016/0072455 | A1 | 3/2016 | Lin | |
| 2020/0382088 | A1 | 12/2020 | Saha | |
| 2023/0208357 | A1 * | 6/2023 | Andreani | H03B 5/1228 331/117 FE |

FOREIGN PATENT DOCUMENTS

| | | | |
|---|---|---|---|
| JP | 2017-530622 | A | 10/2017 |
| KR | 10-2004-0080163 | A | 9/2004 |
| KR | 10-0708117 | B1 | 4/2007 |
| KR | 10-2014-0043642 | A | 4/2014 |
| KR | 10-1865612 | B2 | 6/2018 |
| KR | 10-2117628 | B1 | 6/2020 |

OTHER PUBLICATIONS

Sadhu, Bodhisatwa et al., “A 28-GHz 32-Element TRX Phased-Array IC With Concurrent Dual-Polarized Operation and Orthogonal Phase and Gain Control for 5G Communications”, IEEE Journal of Solid State Circuits, vol. 52, No. 12, Dec. 2017, pp. 3373-3391.

Kim, Hong-Teuk et al., “A 28-GHz CMOS Direct Conversion Transceiver With Package 2×4 Antenna Array for 5G Cellular System”, IEEE Journal of Solid-State Circuits, vol. 53, No. 5, May 2018, pp. 1245-1259.

Dunworth, J. D. et al., “A 28GHz Bulk-CMOS Dual-Polarization Phased-Array Transceiver with 24 Channels for 5G User and Basestation Equipment”, ISSCC 2018, Session 4, mm-Wave Radios for 5G and Beyond, 4.4, 2018 IEEE International Solid-State Circuits Conference, Feb. 12, 2018. (3 pages total).

Park, Jinseok et al., “A 28GHZ 20.3%-Transmitter-Efficiency 1.5°-Phase-Error Beamforming Front-End IC with Embedded Switches and Dual-Vector Variable-Gain Phase Shifters”, ISSCC 2019, Session 9, High-Frequency Transceivers for Radar and Communications, 9.8, 2019 IEEE International Solid-State Circuits Conference, Feb. 19, 2019. (6 pages total).

Min, Byung-Wook et al., “Single-Ended and Differential Ka-Band BiCMOS Phased Array Front-Ends”, IEEE Journal of Solid-Sate Circuits, vol. 43, No. 10, Oct. 2008, pp. 2239-2250.

International Search Report (PCT/ISA/210) issued Apr. 7, 2022 by the International Searching Authority in counterpart International patent application No. PCT/KR2021/018970.

Written Opinion (PCT/ISA/237) issued Apr. 7, 2022 by the International Searching Authority in counterpart International patent application No. PCT/KR2021/018970.

Communication issued Jun. 29, 2026 by the Korean Ministry of Intellectual Property in Korean Patent Application No. 10-2020-0175742.

* cited by examiner 400
410-2
410
410-1
416-1
416-2
180°
0°
414-2
412-2
418-4
414-1
418-3
426-1
420
424-2
422-2
424-1
422-1
426-2
418-1
412-1
418-2
1M N_1
2M N_1
1M N_2
2M N_2
2M P_2
1M P_2
2M P_1
1M P_1
3M N
3M P
V C,N1_1
V C,N1_2
V C,N2_1
V C,P2_2
V C,P2_1
V C,P1_2
V C,P1_1

APPARATUS AND METHOD FOR AMPLIFYING TRANSMISSION/RECEPTION SIGNAL AND CONTROLLING PHASE OF TRANSMISSION/RECEPTION SIGNAL IN WIRELESS COMMUNICATION SYSTEM

CROSS REFERENCE TO RELATED APPLICATIONS

The present application is a continuation of international application PCT/KR2021/018970 filed on Dec. 14, 2021 and claims benefit of priority to KR 10-2020-0175742 filed Dec. 15, 2020 in the Korean Intellectual Property Office (KIP0). The above applications are hereby incorporated by reference.

FIELD

The disclosure generally relates to a device for a transmission/reception signal and, more particularly, to a device and method for amplifying a transmission/reception signal and controlling the phase of a transmission/reception signal in a wireless communication system.

BACKGROUND

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a “beyond 4G network” communication system or a “post long term evolution (post LTE)” system.

The 5G communication system is considered to be implemented in ultrahigh frequency bands (e.g., 60 GHz bands) so as to accomplish higher data rates. To decrease propagation loss of the radio waves and increase the transmission distance in the ultrahigh frequency bands, beamforming, massive multiple-input multiple-output (massive MIMO), full dimensional MIMO (FD-MIMO), array antenna, analog beam forming, large scale antenna techniques are discussed in 5G communication systems.

In addition, in 5G communication systems, development for system network improvement is under way based on advanced small cells, cloud radio access networks (cloud RANs), ultra-dense networks, device-to-device (D2D) communication, wireless backhaul, moving network, cooperative communication, coordinated multi-points (CoMP), reception-end interference cancellation and the like.

In the 5G system, hybrid FSK and QAM modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have also been developed.

Products equipped with multiple antennas are being developed to increase communication performance, and it is expected that equipment having a much larger number of antennas is to be used by utilizing massive MIMO technology. As the number of antenna elements in a communication device increases, the number of RF components (e.g., filters) also inevitably increases accordingly.

SUMMARY

Based on the foregoing discussion, the disclosure provides a device and method for efficiently amplifying a transmission/reception signal and controlling the phase of a transmission/reception signal in a wireless communication system.

In addition, the disclosure provides a device and a method capable of performing 180° phase shifting of an RF signal according to switching of each transistor, while concurrently amplifying power of the RF signal in a wireless communication system.

In addition, the disclosure provides a device and a method in which, in a wireless communication system, symmetrical left and right-side transistors may be referred to as a single input unit, and two input units among a number of input units are selected by switching.

In addition, the disclosure provides a structure of adding a transistor pair in a wireless communication system.

In addition, the disclosure provides a structure of using a phase controller in a wireless communication system.

According to various embodiments of the disclosure, a device may include a first amplifier configured to amplify an input signal, and a second amplifier connected to the first amplifier and having a common gate structure of amplifying a signal output from the first amplifier, wherein the second amplifier includes a first input unit, a second input unit, a third input unit, and a fourth input unit, and two input units among the first input unit, the second input unit, the third input unit, and the fourth input unit are connected to the first amplifier.

According to various embodiments of the disclosure, the first amplifier may have a common source structure and include cross-coupled capacitors.

According to various embodiments of the disclosure, the first input unit and the second input unit may amplify a signal output from the first amplifier without inverting a phase of the signal.

According to various embodiments of the disclosure, the third input unit and the fourth input unit may amplify a signal output from the first amplifier while inverting a phase of the signal.

According to various embodiments of the disclosure, first sides of the first input unit and the second input unit may be connected to a non-inverting output unit, and second sides may be connected to an inverting output unit.

According to various embodiments of the disclosure, first sides of the third input unit and the fourth input unit may be connected to an inverting output unit, and second sides may be connected to a non-inverting output unit.

According to various embodiments of the disclosure, the first input unit, the second input unit, the third input unit, and the fourth input unit may have different voltage gains, respectively.

According to various embodiments of the disclosure, at least one of the first input unit, the second input unit, the third input unit, and the fourth input unit may be additionally divided so as to have a different voltage gain.

According to various embodiments of the disclosure, each of the first input unit, the second input unit, the third input unit, and the fourth input unit may include a pair of transistors, and a voltage gain may be controlled using a channel width for the each pair of transistors.

According to various embodiments of the disclosure, additional division may be performed for the each pair of transistors, at least one of the divided transistors may be connected, and a voltage gain may be controlled using a channel width for the connected divided transistor.

A device and a method according to various embodiments of the disclosure can improve the overall performance of an RFIC by minimizing an area and power loss of an attenuation circuit compared to conventional methods, by adding a transistor pair and using a phase controller.

Advantageous effects obtainable from the disclosure may not be limited to the above mentioned effects, and other effects which are not mentioned may be clearly understood, through the following descriptions, by those skilled in the art to which the disclosure pertains.

DETAILED DESCRIPTION

Figure 1A:
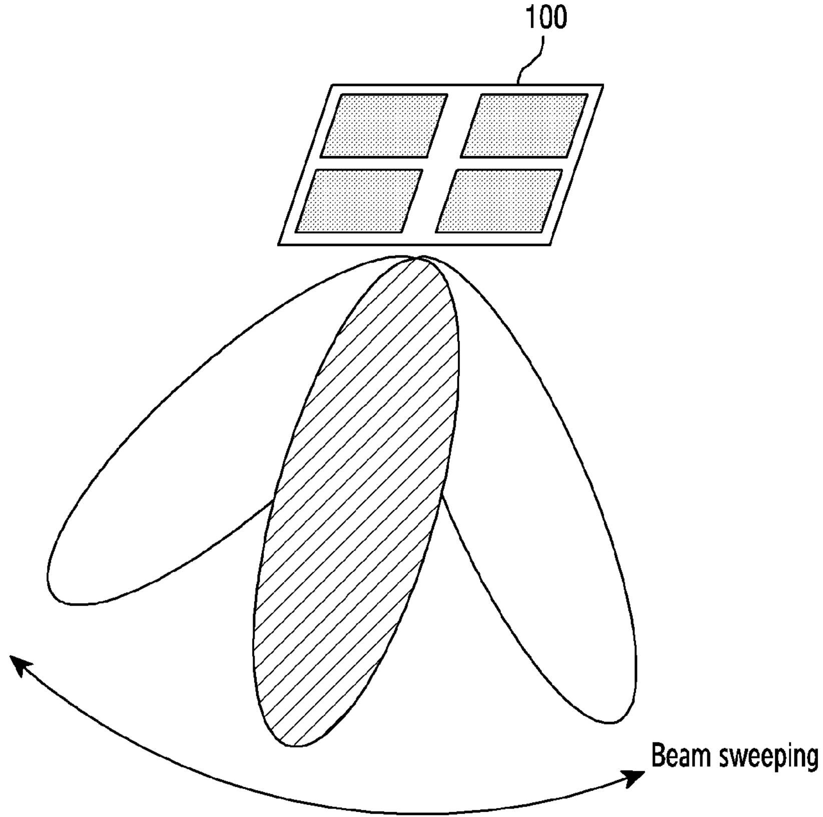
FIG. 1A is a diagram illustrating beam sweeping via a wireless communication chip in a wireless communication system according to various embodiments of the disclosure.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

In the description below, terms referring to signals, terms referring to device elements or circuit elements, and the like are illustratively used for the sake of descriptive convenience. Therefore, the disclosure is not limited by the terms as used below, and other terms referring to subjects having equivalent technical meanings may be used.

For a system using a high frequency, for example, millimeter waves (mmWave), like a 5th generation (5G) system, a phased array radio frequency integrated circuit (RFIC) is actively developing. There is a need for development of a power amplifier having high power, high efficiency, and high linearity in an RFIC. In order to increase power and gain, a cascode or a stacked structure may be applied, differential and capacitor neutralization (Cneu) technology may be applied to improve the gain, stability, and power in a millimeter wave band (e.g., 28/39/60 GHz), and the same technology may be applied to implementation of a cascode/stacked power amplifier.

In the description below, terms referring to electronic device components (e.g., substrate, plate, printed circuit board (PCB), flexible PCB (FPCB), module, antenna, antenna element, circuit, processor, chip, element, and device), terms referring to component shapes (e.g., tuning member, tuning structure, tuning structural body, structure, support, contact, protrusion, and opening), terms referring to connections between structures (e.g., connection part, contact part, support part, contact structure, conductive member, and assembly), terms referring to circuits (e.g., transmission line, PCB, FPCB, signal line, feeding line, data line, RF signal line, antenna cable, RF path, RF module, and RF circuit), and the like are illustratively used for the sake of descriptive convenience. Therefore, the disclosure is not limited by the terms as used below, and other terms referring to subjects having equivalent technical meanings may be used. Furthermore, as used below, the terms "unit", "device", "member", "body", and the like may indicate at least one shape structure or may indicate a unit for processing a function.

As used in the disclosure, the expression "greater than" or "less than" is used to determine whether a specific condition is satisfied or fulfilled, but this is intended only to illustrate an example and does not exclude "greater than or equal to" or "equal to or less than". A condition indicated by the expression "greater than or equal to" may be replaced with a condition indicated by "greater than", a condition indicated by the expression "equal to or less than" may be replaced with a condition indicated by "less than", and a condition indicated by "greater than and equal to or less than" may be replaced with a condition indicated by "greater than and less than".

In the disclosure, various embodiments will be described using terms employed in some communication standards (e.g., the 3rd generation partnership project (3GPP) and institute of electrical and electronics engineers (IEEE)), but they are only for the sake of illustration. The embodiments of the disclosure may also be easily applied to other communication systems through modifications.

FIG. 1A is a diagram illustrating beam sweeping via a wireless communication chip in a wireless communication system according to various embodiments of the disclosure.

According to an embodiment, in a communication system using a mmWave band, a new method different from a conventional wireless communication method should be considered. For example, in a mmWave band, a gain loss of a beam emitted via an electronic device may increase as a frequency increases.

According to an embodiment, a multi-chain structure may be used to minimize a gain loss of a beam in a mmWave band. For example, an electronic device may include at least one wireless communication chip 100, and the at least one wireless communication chip 100 may generate four multi-chains.

According to various embodiments, the electronic device including the wireless communication chip 100 may form a beam and perform beam sweeping by using the multi-chains generated via the wireless communication chip 100. (Multi-chain may refer to multiple radio frequency (RF) chains.)

According to an embodiment, the number of multi-chains that may be generated via one wireless communication chip 100 may be 16 or 32. According to various embodiments, the electronic device may include four wireless communication chips, and each wireless communication chip included in the electronic device may generate 32 multi-chains.

Figure 1B:
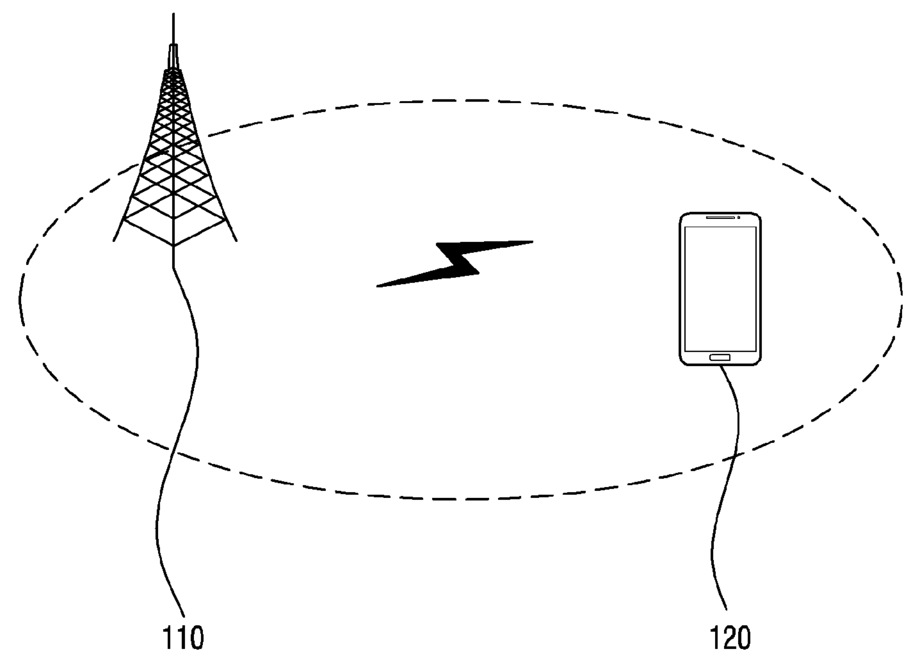
FIG. 1B illustrates a wireless communication system according to various embodiments of the disclosure.

FIG. 1B illustrates a wireless communication system according to various embodiments of the disclosure. A wireless communication environment of FIG. 1B illustrates a base station 110 and a terminal 120 as some of nodes using a radio channel.

The base station 110 is a network infrastructure that provides radio access to the terminal 120. The base station 110 has coverage defined to be a predetermined geographic area on the basis of a distance over which a signal may be transmitted. The base station 110 may be referred to as, in addition to a base station, a "massive multiple input multiple output (MIMO) unit (MMU)", an "access point (AP)", an "eNodeB (eNB)", a "5th generation node (5G node)", a "5G NodeB (NB)", a "wireless point", a "transmission/reception point (TRP)", an "access unit", a "distributed unit (DU)", a "radio unit (RU)", a "remote radio head (RRH)", or other terms having equivalent technical meanings. The base station 110 may transmit a downlink signal or receive an uplink signal.

The terminal 120 is a device used by a user and performs communication with the base station 110 via a radio channel. In some cases, the terminal 120 may be operated without user involvement. That is, the terminal 120 is a device that performs machine type communication (MTC), and may not be carried by a user. The terminal 120 may be referred to as, in addition to a terminal, a "user equipment (UE)", a "mobile station", a "subscriber station", a "customer premises equipment (CPE)", a "remote terminal", a "wireless terminal", an "electronic device", a "vehicle terminal", a "user device", or other terms having equivalent technical meaning.

Figure 1C:
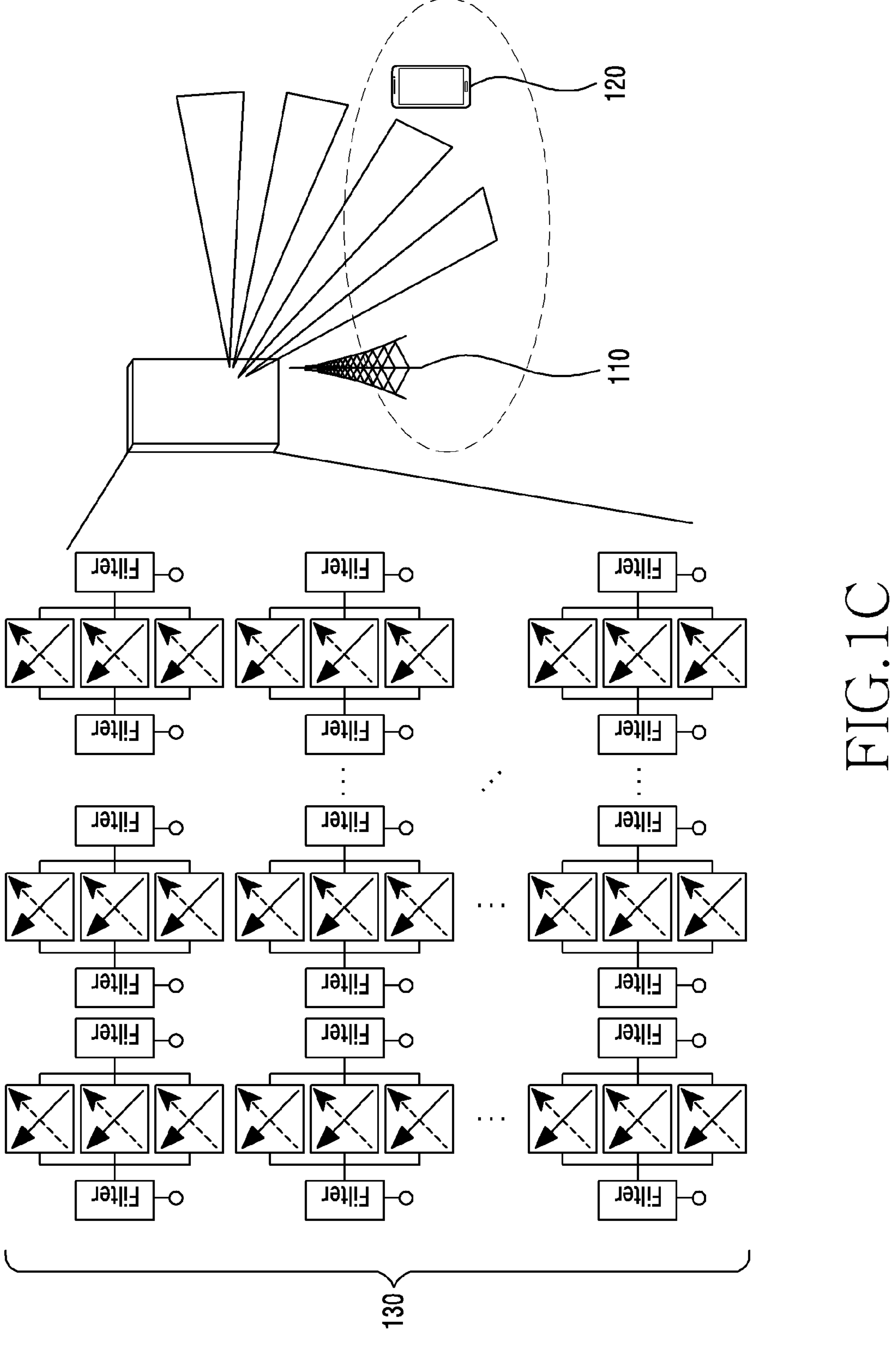
FIG. 1C illustrates an example of an antenna array in a wireless communication system according to various embodiments of the disclosure.

FIG. 1C illustrates an example of an antenna array in a wireless communication system according to various embodiments of the disclosure. As one of technologies for mitigating a propagation path loss and increasing a propagation distance of radio waves, a beamforming technology has been used. Beamforming generally concentrates coverage of radio waves by using multiple antennas, or increases the directivity of reception sensitivity in a specific direction. Accordingly, in order to form beamforming coverage instead of forming a signal in an isotropic pattern by using a single antenna, the base station 110 may include multiple antennas. Hereinafter, an antenna array including multiple antennas is described. The example of the antenna array illustrated in FIG. 1C is only an example for describing embodiments of the disclosure, and is not construed as limiting other embodiments of the disclosure.

Referring to FIG. 1C, the base station 110 may include an antenna array 130. According to an embodiment, the base station 110 may include a massive MIMO unit (MMU) including the antenna array 130. Each antenna included in the antenna array 130 may be referred to as an array element or an antenna element. In FIG. 1C, the antenna array 130 is illustrated as a two-dimensional planar array, but this is merely an example and does not limit other examples of the disclosure. According to another embodiment, the antenna array 130 may be configured in various forms, such as a linear array. An antenna array may be referred to as a massive antenna array.

A primary technology for improving data capacity of 5G communication is a beamforming technology using an antenna array connected to multiple RF paths. For higher data capacity, either the number of RF paths needs to be increased or power per RF path needs to be increased. Increasing of RF paths increases the size of products, and is currently at a level that can no longer be increased due to space limitations in installing actual base station equipment. In order to increase an antenna gain via a high power output without increasing the number of RF paths, multiple antenna elements may be connected to the RF paths by using a splitter (or divider), so as to increase the antenna gain.

In order to improve communication performance, the number of antennas (or antenna elements) of equipment (e.g., the base station 110) performing wireless communication is increasing. In addition, the number of components and RF parts (e.g., an amplifier and a filter) for processing an RF signal received or transmitted through an antenna element increases, so that, in configuration of communication equipment, spatial gain and cost efficiency are essentially required while satisfying communication performance. As the number of paths increases, the number of filters for processing signals in each antenna element also increases.

An RF filter may include a circuit that performs filtering to transfer a radio signal of a desired frequency by forming resonance. That is, the RF filter may perform a function to selectively identify a frequency. Such an RF filter is an important component for selecting and attenuating a frequency, and is used in most communication equipment. Although there are many filters that have many advantages in terms of miniaturization, such as a ceramic filter and a bulk acoustic wave (BAW) filter, since performance of a cavity filter is excellent in terms of power handling and capacity/insertion loss/attenuation performance, the cavity filter is used in multiple pieces of communication equipment. Although a ceramic filter and a BAW filter are available in an MMU/small cell requiring small power specifications, the use of the cavity filter is continuously required in a high-performance MMU and all remote radio units (RRUs). Therefore, miniaturization/light weight and unit price of the cavity filter are very important factors in securing competitiveness of communication equipment.

Figure 2A:
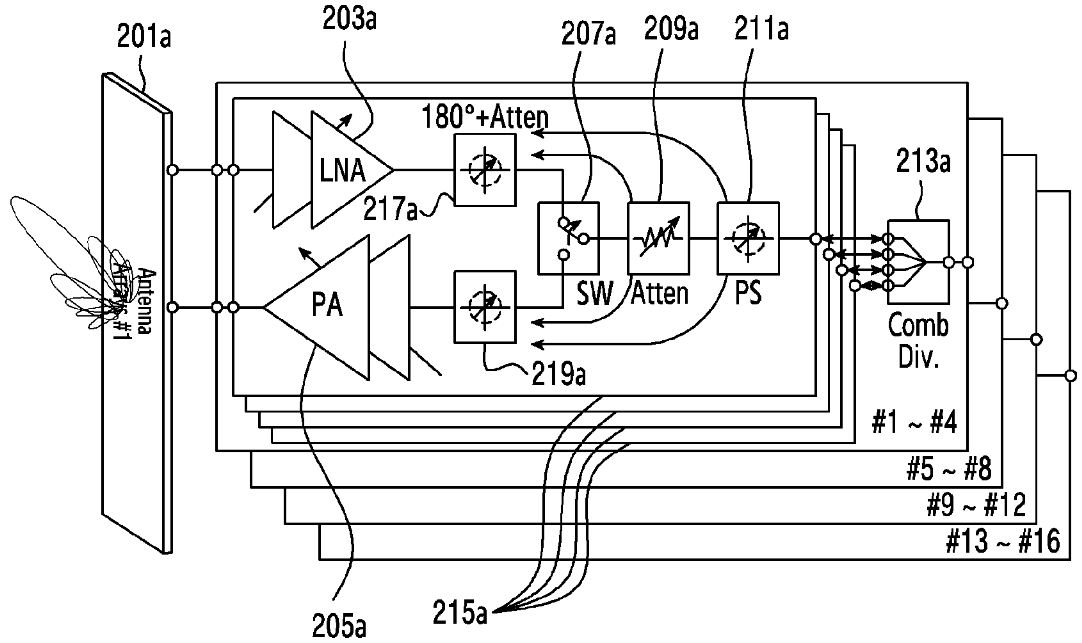
FIG. 2A is a diagram illustrating a multi-chain type radio frequency integrated circuit (RFIC) in a wireless communication system according to various embodiments of the disclosure.

FIG. 2A is a diagram illustrating a multi-chain type radio frequency integrated circuit (RFIC) in a wireless communication system according to various embodiments of the disclosure.

According to an embodiment, an electronic device 200*a* may include a first antenna array (antenna array #1) 201*a* including a first amplifier 205*a* for amplifying a signal received from a communication circuit. According to various embodiments, the signal received from the communication circuit may be a radio frequency (RF) signal.

According to an embodiment, a signal distributor 213*a* may transmit an RF signal received from a communication circuit to each antenna array 215*a*. According to various embodiments, each of the antenna array 215*a* may form a beam of a specific frequency band, based on the RF signal distributed from the signal distributor 213*a*. According to an embodiment, the specific frequency band may be a frequency band used in a 5G mobile communication system. For example, each antenna array 215*a* may form a beam having a center frequency of 60 GHz, 39 GHz, or 28 GHz. According to an embodiment, the signal distributor 213*a* may operate as a signal combiner that combines RF signals received from the respective antenna arrays 215*a*.

According to an embodiment, the first antenna array 201*a* may include a phase shifter (PS) 211*a* configured to shift a phase of an RF signal distributed from the signal distributor 210*a*, a switch (SW) 207*a* configured to selectively connect a transmission end and a reception end, a first amplifier 205*a* connected to a transmission end of the first antenna array 201*a* of the first antenna array 201*a* so as to amplify power of an RF signal supplied from the communication circuit, and a second amplifier 203*a* connected to an output end of the first antenna array 201*a* so as to amplify power of an RF signal supplied from the electronic device 200*a*.

According to an embodiment, the first amplifier 205*a* may be a power amplifier (PA) amplifier, and the second amplifier 203*a* may be a low-noise amplifier (LNA) amplifier. According to various embodiments, the second amplifier 203*a* has a small noise figure (NF), so that noise generated by the amplifier may be small.

According to an embodiment, the electronic device 200*a* may form a first chain via the first antenna array 201*a* and include a multi-chain structure via each antenna array 215*a*.

According to an embodiment, the electronic device 200*a* may form a first chain via the first antenna array 201*a* and include a multi-chain structure via each antenna array 215*a*.

According to an embodiment, if a pair of crossed transistors are added at a common gate position between 219*a* the first amplifier 205*a* and the first switch 207*a* or between 217*a* the second amplifier 203*a* and the first switch 207*a*, and respective transistors are divided into several transistors having a specific ratio and disposed so as to be connected, an RF signal may be phase-shifted by 180° according to switching of each transistor, while power of the RF signal is being amplified at the same time.

However, according to other embodiments, in the drawing, it is illustrated that a circuit configured to control phase and power is disposed between 219*a* the first amplifier 205*a* and the first switch 207*a* or between 217*a* the second amplifier 203*a* and the first switch 207*a*, but, without being limited to this position, the circuit may also be disposed at other positions.

Figure 2B:
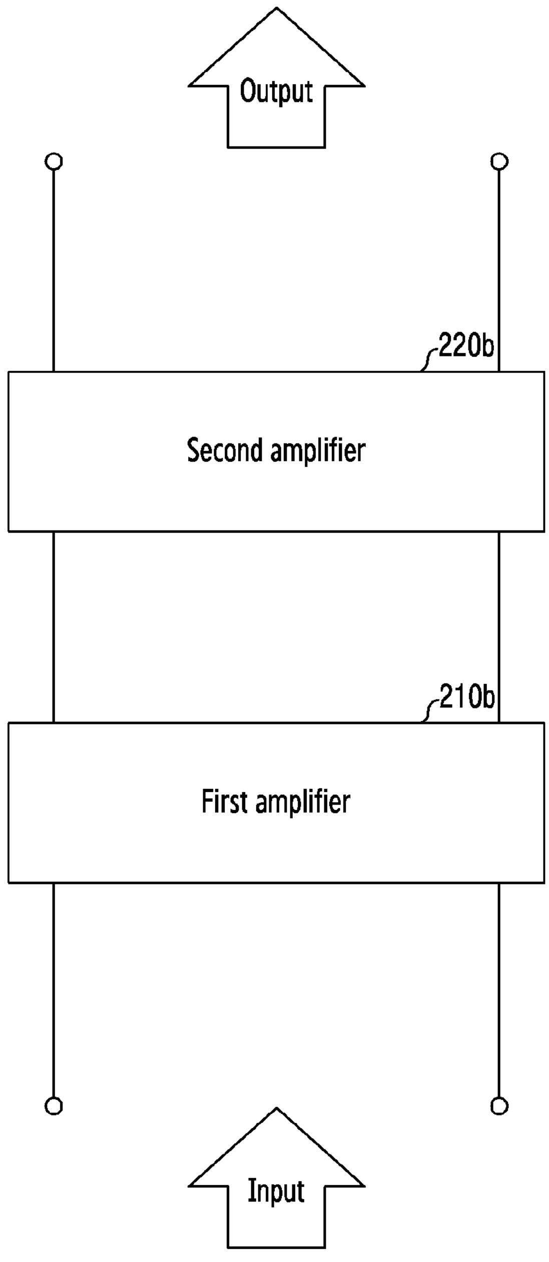
FIG. 2B is a diagram illustrating a configuration of a circuit for amplifying a transmission/reception signal and controlling a phase of the transmission/reception signal so as to improve the performance of an RFIC in a wireless communication system according to various embodiments of the disclosure.

FIG. 2B is a diagram illustrating a configuration of a circuit for improving the performance of an RFIC in a wireless communication system according to various embodiments of the disclosure. Referring to FIG. 2B, a circuit may include a first amplifier 210*b* and a second amplifier 220*b*.

The first amplifier 210*b* amplifies an input signal, and the second amplifier 220*b* amplifies the signal output from the first amplifier 210*b*. That is, the first amplifier 210*b* and the second amplifier 220*b* form a cascode or stacked amplifier.

According to an embodiment, the first amplifier 210*b* is connected to an input terminal of a power amplifier, and the second amplifier 220*b* is connected to an output terminal of the power amplifier. The first amplifier 210*b* and the second amplifier 220*b* may be differential amplifiers. For example, the first amplifier 210*b* may have a common source (CS) structure, and the second amplifier 220*b* may have a common gate (CG) structure.

According to an embodiment, the first amplifier 210*b* has a structure according to a capacitor neutralization (Cneu) technology, that is, may include cross-couple-capacitors. In this case, the first amplifier 210*b* may increase gain of the entire amplifier circuit.

Figure 2C:
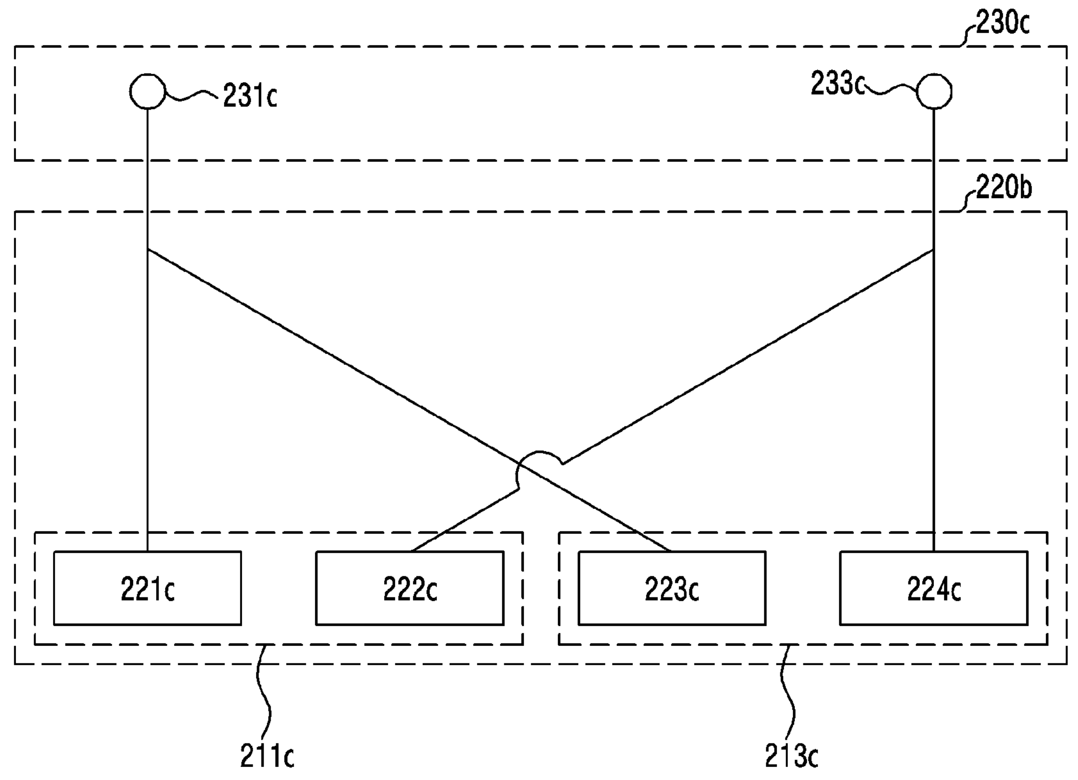
FIG. 2C is a diagram illustrating a second amplifier and an output unit of FIG. 2B in the configuration of the circuit to improve the performance of an RFIC in a wireless communication system according to various embodiments of the disclosure.

FIG. 2C is a diagram illustrating the second amplifier and the output unit of FIG. 2B in the configuration of the circuit to improve the performance of an RFIC in a wireless communication system according to various embodiments of the disclosure. Referring to FIG. 2C, the second amplifier 220*b* may include a first-side amplifier 211*c* and a second-side amplifier 213*c*, and an output unit 230*c* may include a first-side output unit 231*c* and a second-side output unit 233*c*. In addition, the first-side amplifier 211*c* may include amplifier a 221*c* and amplifier b 222*c*, and the second-side amplifier 213*c* may include amplifier c 223*c* and amplifier d 224*c*.

(1) Case in which a Phase of an Input Signal is Amplified without being Shifted

According to an embodiment, when the first-side amplifier 211*c* is connected to the first-side output unit 231*c*, and the second-side amplifier 213*c* is connected to the second-side output unit 233*c*, a signal may be amplified without inverting a phase (that is, this refers to a case in which amplifier a 221*c* is connected to the first-side output unit 231*c*, and amplifier d 224*c* is connected to the second-side output unit 233*c*).

(2) Case in which an Input Signal is Phase-Shifted and Amplified

According to an embodiment, an input signal may be phase-shifted by 180° as well as amplified by changing an element connected to an output terminal inside the second amplifier 220*b*. Specifically, when the first-side amplifier 211*c* is connected to the second-side output unit 233*c*, and the second-side amplifier 213*c* is connected to the first-side output unit 231*c*, a signal may be phase-inverted and amplified (that is, this refers to a case in which amplifier b 222*c* is connected to the second-side output unit 233*c*, and amplifier c 223*c* is connected to the first-side output unit 231*c*), and based on this, the input signal may be phase-shifted by 180° as well as amplified.

According to an embodiment, an amplification ratio of an input signal may be changed by changing an internal configuration of internal elements of the second amplifier 220*b*. For example, for the second amplifier, an amplification ratio of an input signal may be adjusted by changing the internal configuration of amplifier a 221*c*, amplifier d 224*c*, amplifier b 222*c*, and amplifier c 223*c*.

According to an embodiment, an amplification ratio of an input signal may be changed by changing an element connected to an internal output terminal of the second amplifier 220*b*. For example, by connecting a part of amplifier a 221*c* to the first-side output unit 231*c* and connecting a part of amplifier d 224*c* to the second-side output unit 233*c*, while concurrently connecting a part of amplifier b 222*c* to the second-side output unit 233*c* and connecting a part of amplifier c 223*c* to the first-side output unit 231*c*, an amplification ratio of an input signal may be adjusted.

Figure 3:
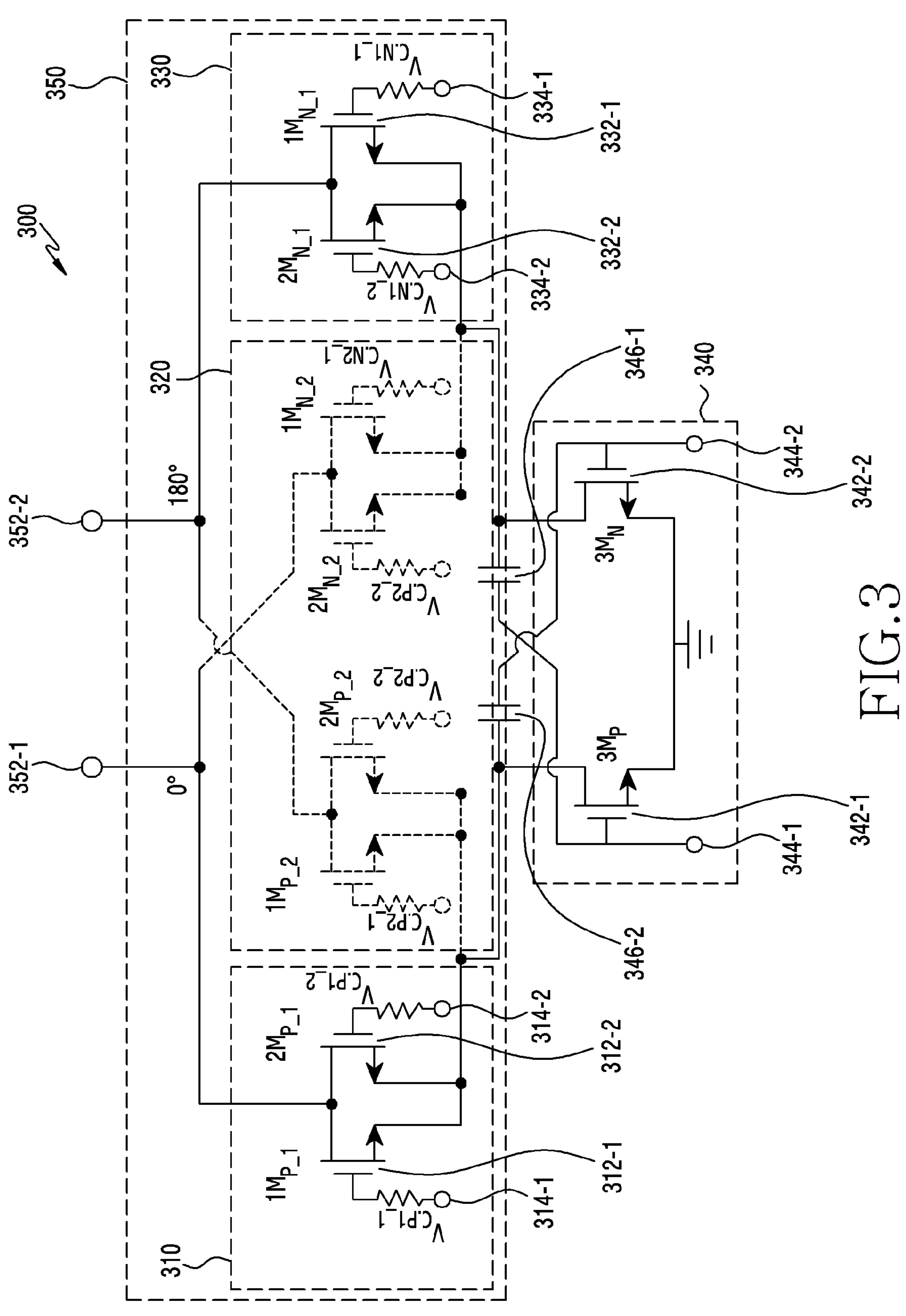
FIG. 3 illustrates an implementation example of a circuit for amplifying a transmission/reception signal and controlling a phase of the transmission/reception signal so as to improve the performance of an RFIC in a wireless communication system according to various embodiments of the disclosure.

FIG. 3 illustrates an implementation example of a circuit for controlling a phase and power of a signal, for improving the performance of an RFIC in a wireless communication system according to various embodiments of the disclosure.

Referring to FIG. 3, a first amplifier 340 is a differential amplifier having a common source structure and may include cross-couple-capacitors. Specifically, the first amplifier 340 may include a first transistor pair, and the first transistor pair may include a first transistor 342-1 and a second transistor 342-2.

According to an embodiment, source terminals of the first transistor 342-1 and the second transistor 342-2 may be grounded, and gate terminals may be connected to input terminals 344-1 and 344-2. In addition, a drain terminal of the first transistor 342-1 is connected to one end of a first capacitor 346-1, and the other end of the first capacitor 346-1 may be connected to a gate terminal of the second transistor 342-2. In addition, a drain terminal of the second transistor 342-2 is connected to one end of a second capacitor 346-2, and the other end of the second capacitor 346-2 may be connected to a gate terminal of the first transistor 342-1. The drain terminals of the first transistor 342-1 and the second transistor 342-2 are output terminals of the first amplifier 340 and may be connected to input terminals of a second amplifier 350.

The second amplifier 350 is a differential amplifier having a common gate structure. Specifically, the second amplifier 350 may include a second transistor pair 310 and a fifth transistor pair 330. The second transistor pair 310 may include a third transistor 312-1 and a fourth transistor 312-2. Similarly, the fifth transistor pair 330 may include a ninth transistor 332-2 and a tenth transistor 332-1.

Source terminals of the third transistor 312-1 and the fourth transistor 312-2 are input terminals of the second amplifier 350 and may be connected to the first amplifier 340, and drain terminals are output terminals and may be connected to a first output terminal 352-1 of the second amplifier 350. In addition, bias voltages 314-1 and 314-2 for gain control may be applied to gate terminals of the third transistor 312-1 and the fourth transistor 312-2, respectively. Source terminals of the ninth transistor 332-2 and the tenth transistor 332-1 are input terminals of the second amplifier 350 and may be connected to the first amplifier 340, and drain terminals are output terminals and may be connected to a second output terminal 352-2 of the second amplifier 350. In addition, bias voltages 334-2 and 334-1 for gain control may be applied to gate terminals of the ninth transistor 332-2 and the tenth transistor 332-1, respectively.

According to an embodiment, for convenience of description, a channel width may be assumed for a transistor. For example, in FIG. 3, channel width of the third transistor 312-1 and the tenth transistor 332-1 may be assumed to have a voltage gain of 1, and channel width of the fourth transistor 312-2 and the ninth transistor 332-2 may be assumed to have a voltage gain of 2. However, a ratio of such length values is not limited to a determined embodiment, and may be applied in the same manner to all cases configured for different length ratios. For example, the channel width of the fourth transistor 312-2 and the ninth transistor 332-2 may be assumed to have a voltage gain of n so that the channel width of the third transistor 312-1 and the tenth transistor 332-1 have a voltage gain of m (m and n are any positive numbers).

As described above, when a channel width is assumed according to a voltage gain, an input signal may be amplified according to a channel width. For example, referring to FIG. 3, a signal received from an input power source may be amplified by the first amplifier 340, and may be amplified by the second amplifier 350 three times in magnitude compared to the magnitude of the signal amplified by the first amplifier 340.

Specifically, the first transistor 342-1 of the first amplifier 340 may be connected to the third transistor 312-1 having a voltage gain of 1 and to the fourth transistor 312-2 having a voltage gain of 2. Also, the second transistor 342-2 of the first amplifier 340 may be connected to the tenth transistor 332-1 having a voltage gain of 1 and to the ninth transistor 332-2 having a voltage gain of 2. In this case, the magnitude of the signal output from the first amplifier 340 may be amplified by one time by the third transistor 312-1 via the connection to the first output terminal 352-1 and by the tenth transistor 332-1 via the connection to the second output terminal 352-2, and the magnitude of the signal output from the first amplifier 340 may be amplified by two times by the fourth transistor 312-2 via the connection to the first output terminal 352-1 and by the ninth transistor 332-2 via the connection to the second output terminal. That is, the voltage gain of the entire circuit may be 3 obtained by summing a voltage gain of 1 according to the third and tenth transistors 312-1 and 332-1 and a voltage gain of 2 according to the fourth and ninth transistors 312-2 and 332-2, and the input signal may be amplified three times in magnitude.

According to an embodiment, although illustrated as dotted lines, instead of being connected to the second transistor pair 310 and the fifth transistor pair 330 of the second amplifier 350, the first amplifier 340 may be connected to a phase controller 320 so as to amplify the signal while shifting a phase of the signal by 180° (phase shifting). The phase controller 320 may include two pairs of transistors. Source terminals of the two pairs of transistors of the phase controller 320 may be connected to the first amplifier 340. In this case, the signal may undergo a phase change of 180°.

A detailed circuit configuration of the phase controller 320 will be described with reference to FIG. 4 below.

Figure 4:
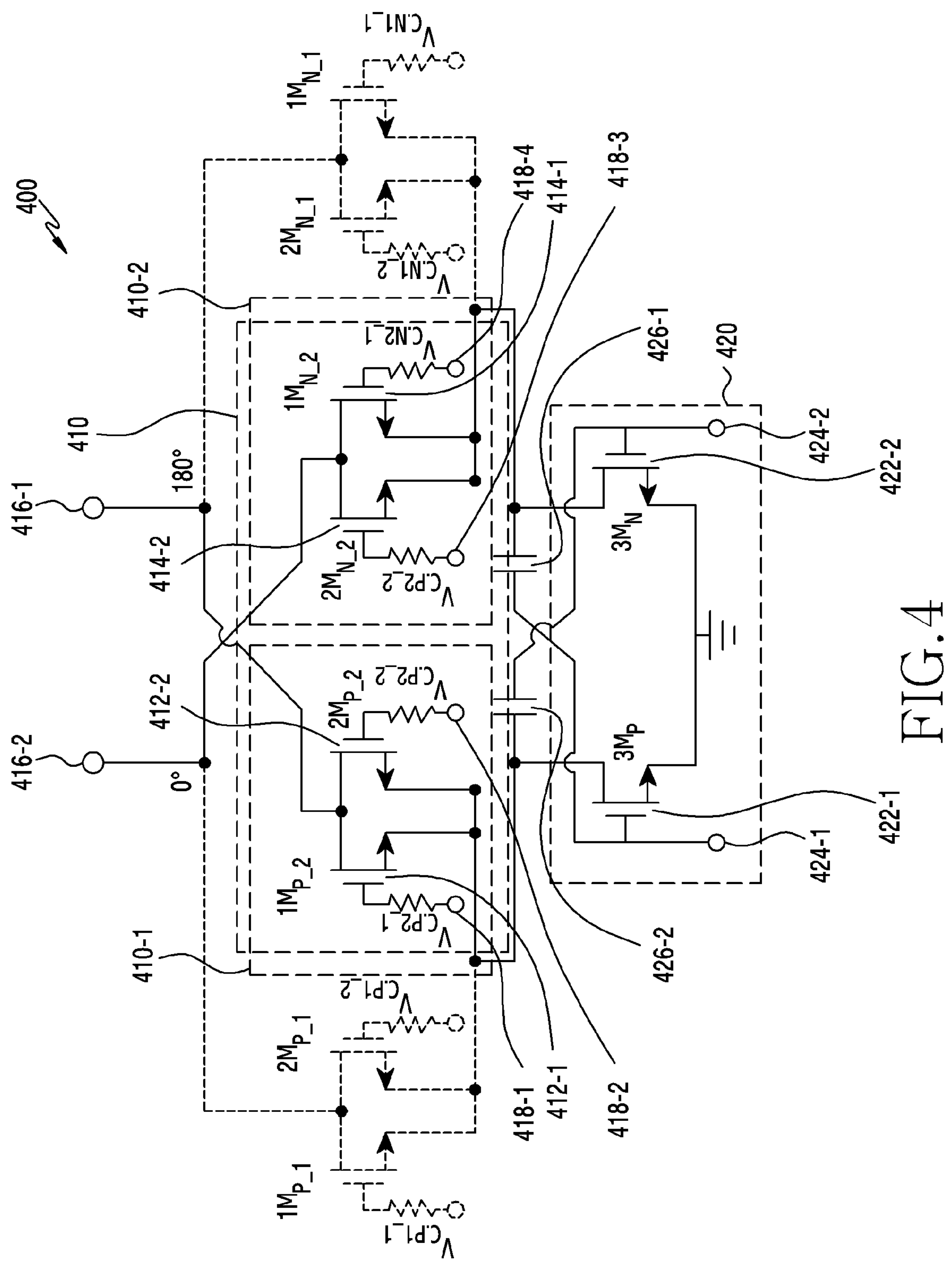
FIG. 4 illustrates another implementation example of a circuit for amplifying a transmission/reception signal and controlling a phase of the transmission/reception signal so as to improve the performance of an RFIC in a wireless communication system according to various embodiments of the disclosure.

FIG. 4 illustrates another implementation example of a circuit for controlling a phase and power of a signal, for improving the performance of an RFIC in a wireless communication system according to various embodiments of the disclosure.

Compared to FIG. 3, instead of being connected to the second transistor pair 310 and the fifth transistor pair 330 of the second amplifier 350, the first amplifier 420 may be connected to a phase controller 410 so as to amplify an input signal while shifting a phase of the input signal by 180° (phase shifting). Specifically, the phase controller 410 included in the second amplifier 350 is a differential amplifier having a common gate structure and may include a third transistor pair 410-1 and a fourth transistor pair 410-2. In addition, the third transistor pair 410-1 may include a fifth transistor 412-1 and a sixth transistor 412-2. Similarly, the fourth transistor pair 410-2 may include a seventh transistor 414-2 and an eighth transistor 414-1.

Source terminals of the fifth transistor 412-1 and the sixth transistor 412-2 are input terminals of the phase controller 410 and may be connected to the first amplifier 420, and drain terminals are output terminals and may be connected to a second output terminal 416-2 of the phase controller 410 included in the second amplifier 350. In addition, bias voltages 418-1 and 418-2 for gain control may be applied to gate terminals of the fifth transistor 412-1 and the sixth transistor 412-2, respectively.

Source terminals of the seventh transistor 414-2 and the eighth transistor 414-1 are input terminals of the phase controller 410 and may be connected to the first amplifier 420, and drain terminals are output terminals and may be connected to the second output terminal 416-2 of the phase controller 410. In addition, bias voltages 418-4 and 418-3 for gain control may be applied to gate terminals of the seventh transistor 414-2 and the eighth transistor 414-1, respectively.

According to an embodiment, in FIG. 4, as described in the embodiment of (2) of FIG. 2C where the input signal is phase-shifted as well as amplified, if the first-side amplifier 211_c_ is connected to the second-side output unit 233_c_ and the second-side amplifier 213_c_ is connected to the first-side output unit 231_c_, a signal may be phase-inverted and amplified, and based on this, an input signal may be phase-shifted by 180° as well as amplified. Specifically, the third transistor pair 410-1 (corresponding to the first-side amplifier 211_c_) may be connected to the first output terminal 416-1 (corresponding to the first-side output unit 231_c_), and the fourth transistor pair 410-2 (corresponding to the second-side amplifier 213_c_) may be connected to the second output terminal 416-2 (corresponding to the second-side output unit 233_c_), so that a signal may be phase-inverted and amplified, and based on this, a phase of an input signal may be shifted by 180°.

According to an embodiment, for convenience of description, a channel width may be assumed for a transistor. For example, in FIG. 4, channel width of the fifth transistor 412-1 and the eighth transistor 414-1 may be assumed to have a voltage gain of 1, and channel width of the sixth transistor 412-2 and the seventh transistor 414-2 may be assumed to have a voltage gain of 2. However, a ratio of such length values is not limited to a determined embodiment, and may be applied in the same manner to all cases configured for different length ratios. For example, the channel width of the sixth transistor 412-2 and the seventh transistor 414-2 may be assumed to have a voltage gain of n so that the channel width of the fifth transistor 412-1 and the eighth transistor 414-1 have a voltage gain of m (m and n are any positive numbers).

As described above, when a channel width is assumed according to a voltage gain, an input signal may be amplified according to a channel width. For example, referring to FIG. 4, signals received from input power sources 424-1 and 424-2 may be amplified by the first amplifier 420, and may be amplified by the phase controller 410 included in the second amplifier 350 three times in magnitude compared to the signal amplified by the first amplifier 420.

Specifically, the first transistor 342-1 of the first amplifier 340 may be connected to the fifth transistor 412-1 having a voltage gain of 1 and to the sixth transistor 412-2 having a voltage gain of 2. Also, the second transistor 342-2 of the first amplifier 340 may be connected to the eighth transistor 414-1 having a voltage gain of 1 and to the seventh transistor 414-2 having a voltage gain of 2. In this case, the signal output from the first amplifier 340 may be amplified by one time by the fifth transistor 412-1 via the connection to the second output terminal 416-2 and by the eighth transistor 414-1 via the connection to the first output terminal 416-1, while concurrently being amplified by inverting the phase of the signal, and the signal output from the phase included in the first amplifier 340 may be amplified by two times by the sixth transistor 412-2 via the connection to the first output terminal 352-1 and by the seventh transistor 414-2 via the connection to the second output terminal, while concurrently being amplified by inverting the phase of the signal. That is, the voltage gain of the entire circuit may be 3 obtained by summing a voltage gain of 1 according to the fifth and eighth transistors 412-1 and 414-1 and a voltage gain of 2 according to the sixth and seventh transistors 412-2 and 414-2. In addition, the input signal may be amplified three times in magnitude, while the phase of the input signal is being shifted by 180° at the same time.

As described above, in various embodiments of the disclosure, by shifting a phase by 180° by using the phase controller 410 included in the second amplifier 350, area and loss may be minimized compared to conventional methods, and therefore overall RFIC performance may be improved.

Figure 5:
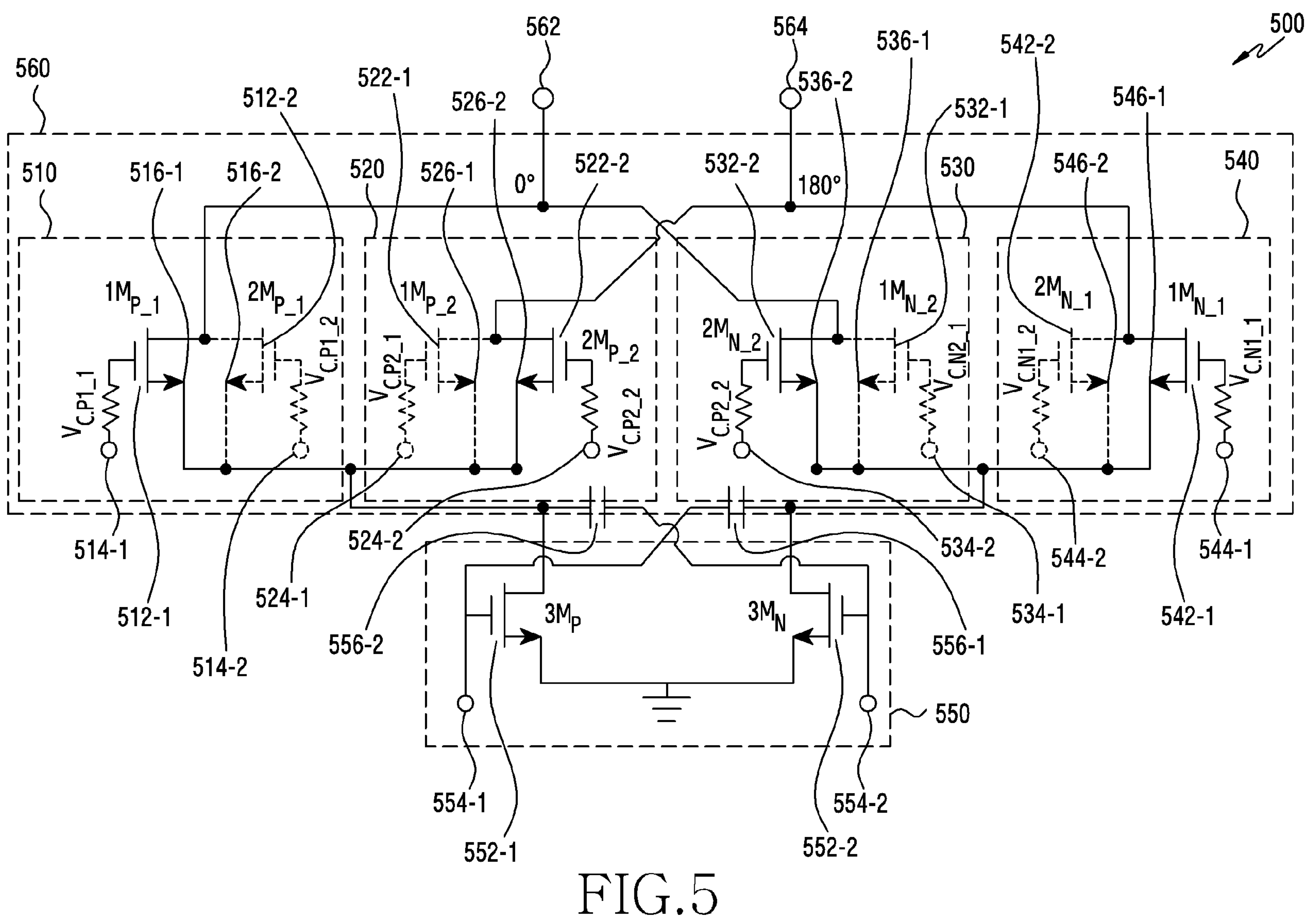
FIG. 5 illustrates another implementation example of a circuit for amplifying a transmission/reception signal and controlling a phase of the transmission/reception signal so as to improve the performance of an RFIC in a wireless communication system according to various embodiments of the disclosure.

FIG. 5 illustrates another implementation example of a circuit for controlling a phase and power of a signal, for improving the performance of an RFIC in a wireless communication system according to various embodiments of the disclosure.

In FIG. 5, an assumption is made for a case of selecting one of two transistors of a second transistor pair and one of two transistors of a third transistor pair, and connecting the same to a first amplifier, wherein a corresponding transistor is also connected to the other side. For example, in FIG. 5, for convenience of description, an assumption is made for a case of connecting, to the first amplifier, a third transistor of the second transistor pair and a sixth transistor of the third transistor pair. In this case, the other side corresponding thereto connects, to the first amplifier, a seventh transistor of a fourth transistor pair and a tenth transistor of a fifth transistor pair. However, the cases above do not limit embodiments of FIG. 5, which are to be described below, and may be applied in the same manner to all cases in which different transistors are connected.

Also, for convenience of description, it may be indicated that a first input unit refers to a third transistor 512-1 and a tenth transistor 542-1, a second input refers to a fourth transistor 512-2 and a ninth transistor 542-2, a third input unit refers to a fifth transistor 522-1 and an eighth transistor 532-1, and a fourth input unit refers to a sixth transistor 522-2 and a seventh transistor 532-2.

Referring to FIG. 5, a circuit may include a first amplifier 550 and a second amplifier 560, which may have the same configuration as the first amplifier 340 and the second amplifier 350 of FIG. 3. Compared to FIG. 3, instead of being connected to the second transistor pair 310 and the fifth transistor pair 330 of the second amplifier 350, the first amplifier 550 may be connected to the first input units 512-1 and 542-1 and the fourth input units 522-2 and 532-2 so as to amplify an input signal for the first input units 512-1 and 542-1 and amplify an input signal for the fourth input units 522-2 and 532-2 while performing phase-shifting by 180° (phase shifting).

Specifically, the second amplifier 560 is a differential amplifier having a common gate structure, wherein source terminals 516-1, 526-2, 536-2, and 546-1 of the first input units 512-1 and 542-1 and the fourth input units 522-2 and 532-2 are input terminals of the second amplifier 560 and may be connected to the first amplifier 550, and drain terminals are output terminals and may be connected to a first output terminal 562 and a second output terminal 564. In addition, bias voltages 514-1, 524-2, 534-2, and 544-1 for gain control may be applied to gate terminals of the third transistor 512-1, the sixth transistor 522-2, the seventh transistor 532-2, and the tenth transistor 542-1, respectively.

According to an embodiment, in FIG. 5, as described in the embodiment of FIG. 2C in which the input signal is amplified without phase shifting or the input signal is phase-shifted and amplified, an input signal may be amplified or phase-shifted.

Specifically, as illustrated in FIG. 5, the first input unit and the fourth input unit are included, and whether an output signal is amplified and is phase-inversed by 180° may be identified by adding output signals of both cases (1) and (2) below.

(1) Case in which a Phase of an Input Signal is Amplified without being Shifted (First Input Unit):

In the first input units 512-1 and 542-1 (corresponding to amplifier a 221*c* and amplifier d 224*c*), the first-side amplifier 211*c* may be connected to the first-side output unit 231*c*, and the second-side amplifier 213*c* may be connected to the second-side output unit 233*c* so as to perform amplification without phase inversion. Specifically, the third transistor 512-1 may be connected to the first output terminal 562 (512-1 is connected to 562, and 562 corresponds to the first-side output unit 231*c*), and the tenth transistor 542-1 may be connected to the second output terminal 564 (542-1 is connected to 564, and 564 corresponds to the second-side output unit 233*c*), so that the input signal may be amplified without phase inversion.

(2) Case in which an Input Signal is Phase-Shifted and Amplified (Fourth Input Unit):

In the fourth input units 522-2 and 532-2 (corresponding to amplifier b 222*c* and amplifier c 223*c*), the first-side amplifier 211*c* may be connected to the second-side output unit 233*c*, and the second-side amplifier 213*c* may be connected to the first-side output unit 231*c*, so as to amplify the input signal while concurrently shifting the phase of the input signal by 180°. Specifically, the sixth transistor 522-2 may be connected to the second output terminal 562 (522-1 is connected to 564, and 564 corresponds to the second-side output unit 233*c*), and the seventh transistor 532-2 may be connected to the first output terminal 564 (532-2 is connected to 562, and 562 corresponds to the first-side output unit 231*c*), so that the input signal may be amplified while the phase of the input signal is being inverted by 180° at the same time.

In the first-side amplifier 211*c* being connected to the second-side output unit 233*c*, and the second-side amplifier 213*c* according to an embodiment, an input signal may be phase-shifted by 180° as well as amplified, by changing an element connected to an output terminal inside the second amplifier 220*b*. Specifically, when the first-side amplifier 211*c* is connected to the second-side output unit 233*c*, and the second-side amplifier 213*c* is connected to the first-side output unit 231*c*, a signal may be phase-inverted and amplified (that is, this refers to a case in which amplifier b 222*c* is connected to the second-side output unit 233*c*, and amplifier c 223*c* is connected to the first-side output unit 231*c*), and based on this, the input signal may be phase-shifted by 180° as well as amplified.

According to an embodiment, for convenience of description, a channel width may be assumed for a transistor. For example, in FIG. 5, channel width of the third transistor 512-1 and the tenth transistor 542-1 may be assumed to have a voltage gain of 1, and channel width of the sixth transistor 522-2 and the seventh transistor 532-2 may be assumed to have a voltage gain of 2. However, a ratio of such length values is not limited to a determined embodiment, and may be applied in the same manner to all cases configured for different length ratios. For example, the channel width of the third transistor 512-1 and the tenth transistor 542-1 may be assumed to have a voltage gain of n so that the channel width of the sixth transistor 522-2 and the seventh transistor 532-2 have a voltage gain of m (m and n are any positive numbers).

As described above, when a channel width is assumed according to a voltage gain, an input signal may be amplified according to a channel width. For example, referring to FIG. 5, signals received from input power sources 554-1 and 554-2 may be amplified by the first amplifier 550, the signals amplified by the first amplifier 550 may be output in the same magnitude by the first input units 512-1 and 542-1 of the second amplifier 560, and the signals amplified by the first amplifier 550 may be amplified two times in magnitude thereof by the fourth input units 522-2 and 532-2 of the second amplifier 560, while the phase of the signal is being shifted by 180° at the same time. When the outputs of the first input units 512-1 and 542-1 and the fourth input units 522-2 and 532-2 are added, the signals received from the input power sources 554-1 and 554-2 may have the same magnitude as the signals amplified by the first amplifier 550, and may be phase-shifted by 180°.

According to an embodiment, in FIG. 5, for convenience of description, it has been assumed that the second amplifier 560 is connected to the first input units 512-1 and 542-1 and the fourth input units 522-2 and 532-2, but the embodiment is not limited thereto, and in this case, two input units among the first input units 512-1 and 542-1, the second input units 512-2 and 542-2, the third input units 522-1 and 532-1, and the fourth input units 522-2 and 532-2 may be connected instead. In this case, the amplified signal magnitude of the input signal and whether the input signal is phase-shifted by 180° may be vary.

As described above, in various embodiments of the disclosure, a signal may be amplified with a desired value or may be phase-shifted by 180° by using the second amplifier 560, area and loss may be minimized compared to conventional methods, and therefore overall RFIC performance may be improved.

Figure 6A:
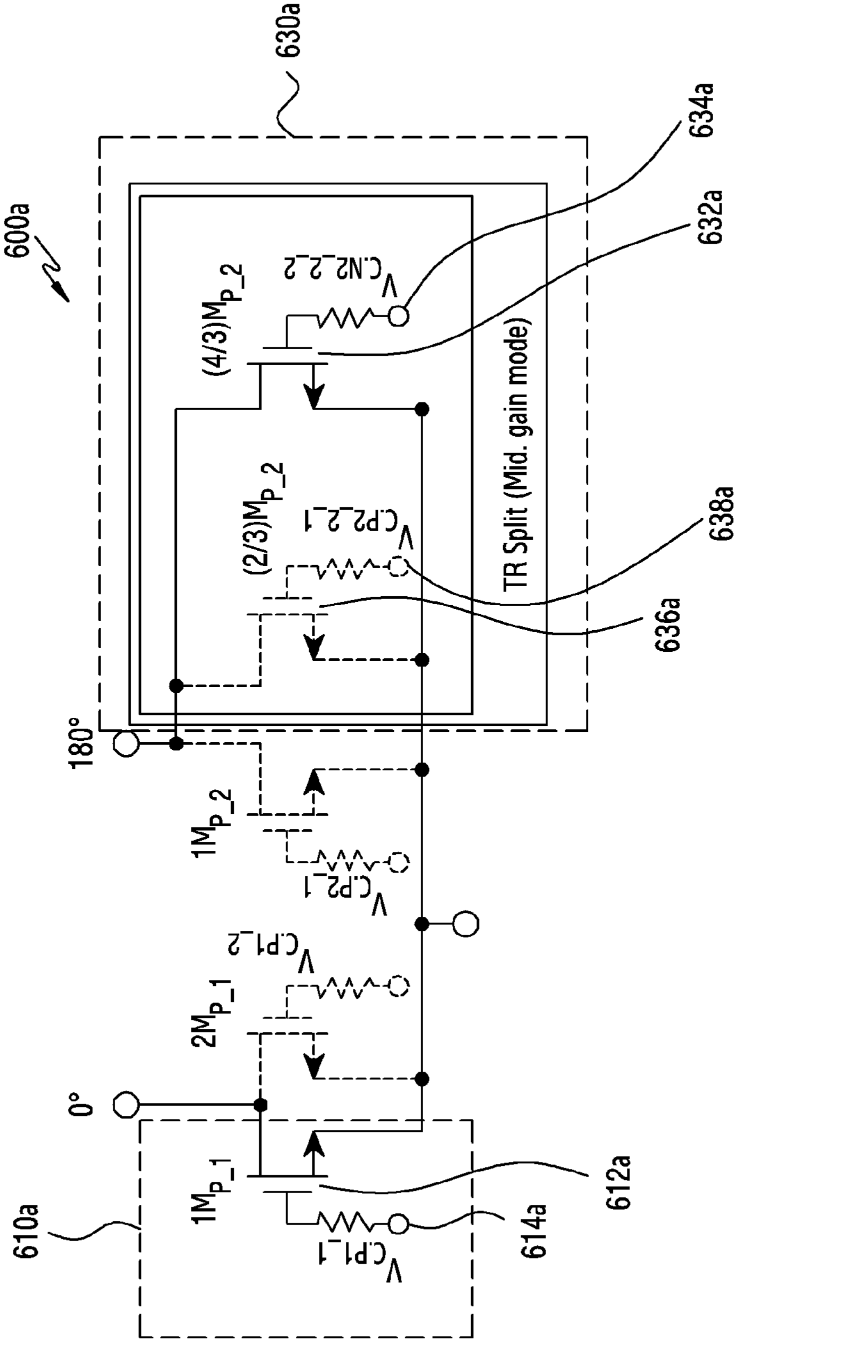
FIG. 6A illustrates a part of another implementation example of a circuit for controlling a phase and power of a signal so as to improve the performance of an RFIC in a wireless communication system according to various embodiments of the disclosure.

FIG. 6A illustrates another implementation example of a circuit for controlling a phase and power of a signal, for improving the performance of an RFIC in a wireless communication system according to various embodiments of the disclosure.

In FIG. 6A, the sixth transistor 522-2 of FIG. 5 may be divided into two (632*a* and 636*a*), via which a voltage gain may be adjusted. Specifically, in FIG. 6A, for convenience of description, an assumption may be made with respect to a channel width for a transistor. For example, channel width of the third transistor 512-1 and the tenth transistor 542-1 may be assumed to have a voltage gain of 1, and channel width of the sixth transistor 522-2 and the seventh transistor 532-2 may be assumed to have a voltage gain of 2. In addition, as illustrated in FIG. 6A, the sixth transistor 522-2 may be divided into two transistors 632*a* and 636*a*. In this case, the two transistors may be assumed to be the 6a-th transistor 632*a* allowing a voltage gain of 4/3 and the 6b-th transistor 636*a* allowing a voltage gain of ⅔, respectively, and it may be assumed that the sum of channel width of the divided two transistors 632*a* and 636*a* is the same as that for the transistors before division. The seventh transistor 532-2 corresponding thereto may also be divided in the same way. However, a ratio of such length values is not limited to a determined embodiment, and may be applied in the same manner to all cases configured for different length ratios.

In FIG. 6A, an assumption is made for a case in which, by switching, a connection is made only to the 6a-th transistor 632*a* and a connection is not made to the 6b-th transistor 636*a*. As described above, when a channel width is assumed according to a voltage gain, an input signal may be amplified according to a channel width. For example, the signals amplified by the first amplifier 550 may be output in the same magnitude by the first input units 512-1 and 542-1 of the second amplifier 560, and may be amplified 4/3 times in magnitude thereof, while being phase-shifted by 180° at the same time, by the divided 6a-th transistor 632*a* (and a transistor divided by 4/3 in the seventh transistor) among the fourth input units 522-2 and 532-2 of the second amplifier 560. According to adding of the outputs, the signals amplified by the first amplifier 550 are attenuated by ⅓ times in magnitude of the signals amplified by the first amplifier 550, and phase-shifting may be performed by 180°.

Figure 6B:
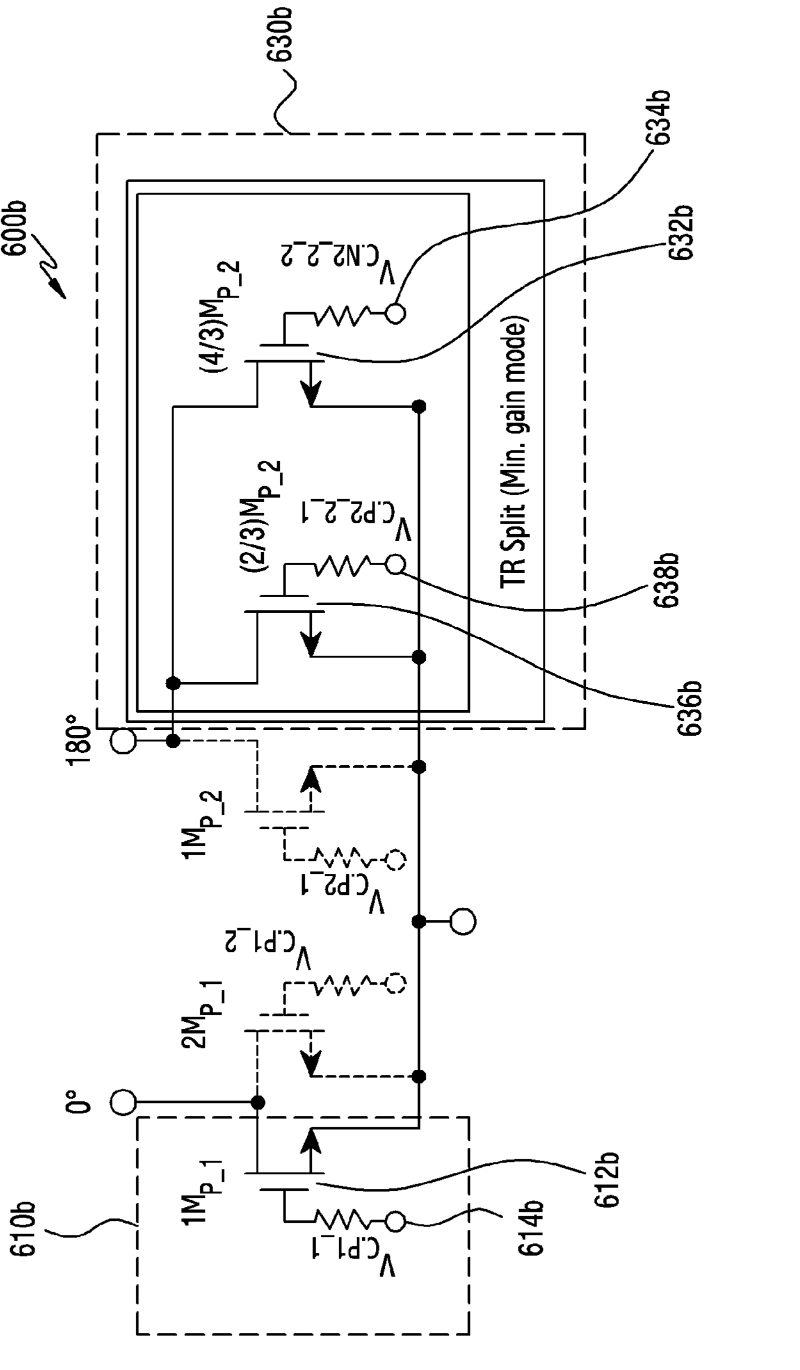
FIG. 6B illustrates a part of another implementation example of a circuit for controlling a phase and power of a signal so as to improve the performance of an RFIC in a wireless communication system according to various embodiments of the disclosure.

FIG. 6B illustrates a part of another implementation example of a circuit for controlling a phase and power of a signal so as to improve the performance of an RFIC in a wireless communication system according to various embodiments of the disclosure.

In FIG. 6B, the sixth transistor 522-2 of FIG. 5 may be divided into two (632*b* and 636*b*), via which a voltage gain may be adjusted. Specifically, in FIG. 6B, for convenience of description, an assumption may be made with respect to a channel width for a transistor. For example, channel width of the third transistor 512-1 and the tenth transistor 542-1 may be assumed to have a voltage gain of 1, and channel width of the sixth transistor 522-2 and the seventh transistor 532-2 may be assumed to have a voltage gain of 2. In addition, as illustrated in FIG. 6B, the sixth transistor 522-2 may be divided into two transistors 632*b* and 636*b*. In this case, the two transistors may be assumed to be the 6b-th transistor 632*b* allowing a voltage gain of 4/3 and the 6b-th transistor 636*b* allowing a voltage gain of ⅔, respectively, and it may be assumed that the sum of channel width of the divided two transistors 632*b* and 636*b* is the same as that for the transistors before division. The seventh transistor 532-2 corresponding thereto may also be divided in the same way. However, a ratio of such length values is not limited to a determined embodiment, and may be applied in the same manner to all cases configured for different length ratios.

In FIG. 6B, an assumption is made for a case in which both the 6a-th transistor 632*b* and the 6b-th transistor 636*b* are connected by switching. As described above, when a channel width is assumed according to a voltage gain, an input signal may be amplified according to a channel width. For example, the signals amplified by the first amplifier 550 may be output in the same magnitude by the first input units 512-1 and 542-1 of the second amplifier 560, and may be amplified two times in magnitude thereof, while being phase-shifted by 180° at the same time, by the divided transistor (632*a*, 632*b*, and a corresponding divided transistor in the seventh transistor) among the fourth input units 522-2 and 532-2 of the second amplifier 560. According to adding of the outputs, the signals amplified by the first amplifier 550 may have the same value as the magnitude of the signals amplified by the first amplification unit 550, and phase-shifting may be performed by 180°.

According to an embodiment, in FIG. 6A and FIG. 6B, for convenience of description, it has been assumed that the second amplifier 560 is connected to the first input units 512-1 and 542-1 and the fourth input units 522-2 and 532-2, but the embodiment is not limited thereto, and in this case, two input units among the first input units 512-1 and 542-1, the second input units 512-2 and 542-2, the third input units 522-1 and 532-1, and the fourth input units 522-2 and 532-2 may be connected instead. In this case, the amplified signal magnitude of the input signal and whether the input signal is phase-shifted by 180° may be vary.

As described above, in various embodiments of the disclosure, a signal may be amplified with a desired value or may be phase-shifted by 180° by dividing some of the transistors of the second amplifier 560 into two, area and loss may be minimized compared to conventional methods, and therefore overall RFIC performance may be improved.

Figure 7:
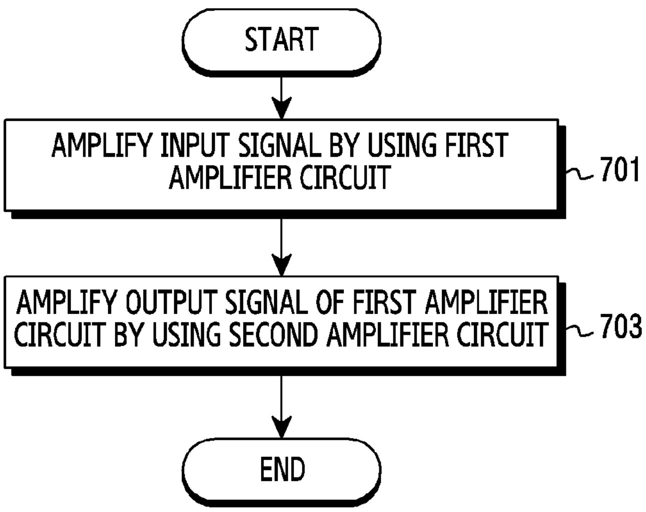
FIG. 7 illustrates a flowchart of a circuit for amplifying a transmission/reception signal and controlling a phase of the transmission/reception signal in a wireless communication system according to various embodiments of the disclosure.

FIG. 7 illustrates a flowchart of a circuit for amplifying a transmission/reception signal and controlling a phase of the transmission/reception signal in a wireless communication system according to various embodiments of the disclosure.

Referring to FIG. 7, in operation 710, a transceiver may amplify an input signal by using a first amplifier circuit. Here, the first amplifier circuit may have a common source structure and include cross-coupled capacitors.

The common source structure may refer to a structure in which a source terminal of a transistor is grounded, an input signal is applied to a gate terminal, and an output signal is obtained from a drain terminal. When the common source structure is used, during designing of an amplifier, a circuit design may be relatively simple, and high gain characteristics may be exhibited at low frequencies. However, since a capacitor capacitance seen from an input side of the common source structure is C(1+Av) (C is a feedback capacitance, and Av is a voltage gain when passing through the first amplifier circuit), high frequency response characteristics may be limited due to the increase in capacitance.

Cross-connected capacitors may refer to capacitors that serve to couple one stage to another stage. Cross-connected capacitors may be used for smooth coupling of signals between two cascaded terminals, and may serve to pass AC voltage and block DC voltage.

In operation 703, the transceiver may amplify the signal output from the first amplifier circuit by using the second amplifier circuit. Here, the second amplifier circuit may have a common gate structure.

The common gate structure may refer to a structure in which an input signal is applied to a source terminal, a gate terminal is grounded, and an output signal is obtained from a drain terminal. Unlike the common source structure, since there is no internal feedback capacitance component, the overall capacitance value may be reduced. Therefore, an environment in which a cutoff frequency may move to a high frequency and may be used even at a high frequency may be formed.

As illustrated in FIG. 5, the circuit may include the first amplifier 550 and the second amplifier 560, wherein a signal is amplified or phase-shifted by 180° by connecting two input units among the first to fourth input units. In addition, a channel width may also be assumed, by which a voltage gain may be additionally adjusted. In addition, as in FIG. 6A and FIG. 6B, a channel width may be assumed for one transistor, this transistor may be divided into two transistors, and in this case, the sum of the channel width of the two transistors may be equal to the channel width of the transistor before division. In this case, the voltage gain may be additionally adjusted according to the channel width of the transistor.

Via operation 710 and operation 720 as described above, the input signal may be amplified with various values while being phase-inverted by 180° at the same time, area and loss may be minimized compared to conventional methods, and therefore the overall RFIC performance may be improved.

Figure 8:
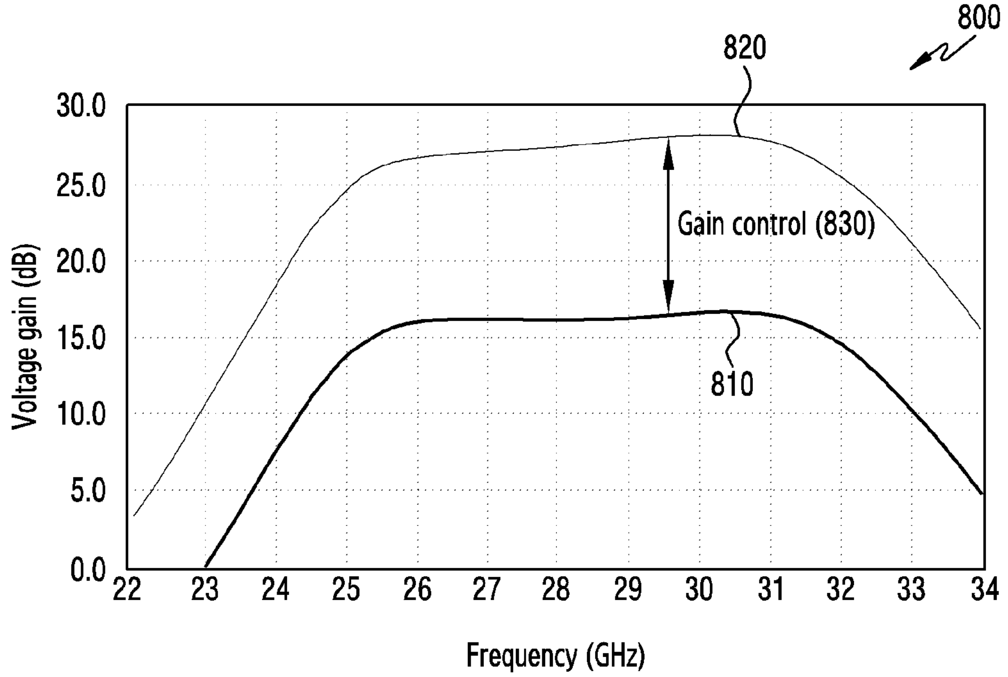
FIG. 8 illustrates gain control performance of a circuit for amplifying a transmission/reception signal and controlling a phase of the transmission/reception signal in a wireless communication system according to various embodiments of the disclosure.

FIG. 8 illustrates gain control performance of a circuit for amplifying a transmission/reception signal and controlling a phase of a transmission/reception signal according to various embodiments of the disclosure. In FIG. 8, the horizontal axis represents a frequency (unit: GHz) and the vertical axis represents voltage gain (unit: dB).

In FIG. 8, a first line 810 represents measured values of voltage gains according to frequencies when power amplification and phase control are not performed, and a second line 820 represents measured values of voltage gains according to frequencies when power amplification and phase control are performed via a common source amplifier and a common gate amplifier. Referring to FIG. 8, it may be identified that the measured values of the voltage gains of the second line 820 are improved (gain control) 830 by at least 10 dB compared to the first line 810, and accordingly it may be identified that the voltage gain is improved by at least 10 dB or more when power amplification and phase control are performed.

Figure 9:
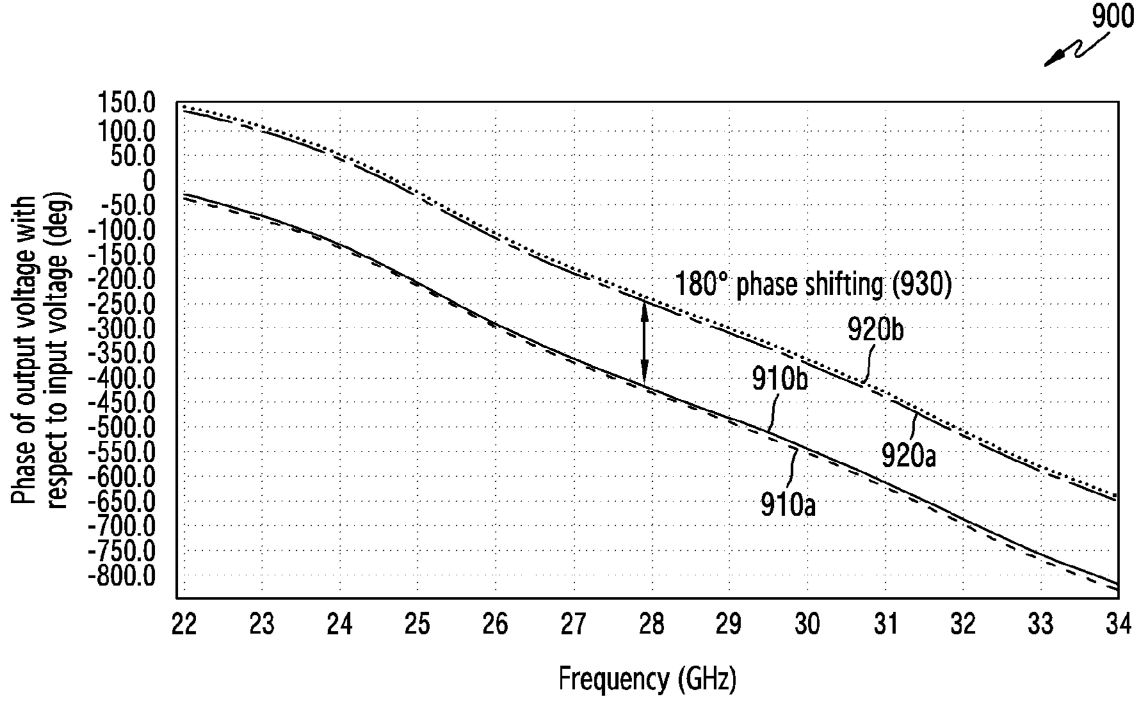
FIG. 9 illustrates phase control performance of a circuit for amplifying a transmission/reception signal and controlling a phase of the transmission/reception signal in a wireless communication system according to various embodiments of the disclosure.

FIG. 9 illustrates phase control performance of a circuit for amplifying a transmission/reception signal and controlling a phase of the transmission/reception signal according to various embodiments of the disclosure. In FIG. 9, the horizontal axis represents a frequency (unit: GHz) and the vertical axis represents a phase (unit: deg) of an output voltage with respect to an input voltage.

In FIG. 9, a first line 910 represents measured values of phases of output voltages with respect to input voltages according to frequencies when power amplification and phase control are not performed, and a second line 920 represents measured values of phases of output voltages with respect to input voltages according to frequencies when power amplification and phase control are performed via a common source amplifier and a common gate amplifier. Referring to FIG. 9, it mm be identified that, compared to the first line 910, the measured values of the phases of the output voltages with respect to the input voltages of the second line 920 are shifted (180° phase shifting) 930 to an extent close to 180°, and accordingly it may be identified that the phases of the output voltages with respect to the input voltages when power amplification and phase control are performed is shifted to an extent close to 180°.

Figure 10:
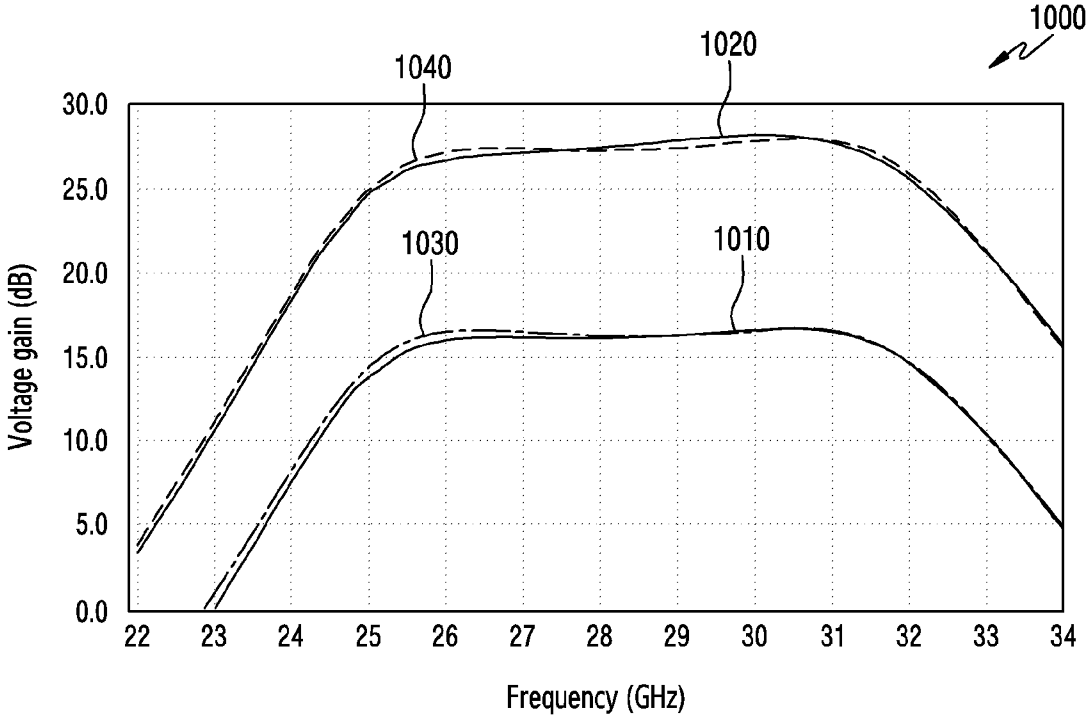
FIG. 10 illustrates a change rate of a voltage gain during a phase control of a circuit for amplifying a transmission/reception signal and controlling a phase of the transmission/reception signal in a wireless communication system according to various embodiments of the disclosure.

FIG. 10 illustrates a change rate of a voltage gain during a phase control of a circuit for amplifying a transmission/reception signal and controlling a phase of the transmission/reception signal in a wireless communication system according to various embodiments of the disclosure. In FIG. 10, the horizontal axis represents a frequency (unit: GHz) and the vertical axis represents voltage gain (unit: dB).

In FIG. 10, a first line 1010 represents measured values of voltage gain according to frequencies when power amplification and phase control are not performed, a second line 1020 represents measured values of voltage gain according to frequencies when only power amplification is performed via a common source amplifier and a common gate amplifier, a third line 1030 represents measured values of voltage gain according to frequencies when only phase control is performed via the common source amplifier and the common gate amplifier, and a fourth line 1040 represents measured values of voltage gain according to frequencies when power amplification and phase control are performed via the common source amplifier and the common gate amplifier.

Referring to FIG. 10, when comparing the first line 1010 obtained when power amplification and phase control are not performed, with the third line 1020 obtained when only phase control is performed without performing of power amplification, it is identified that there is almost no difference in the measured values of the voltage gain. Similarly, when comparing the third line 1030 obtained when only power amplification is performed without performing of phase control, with the fourth case 1040 obtained when both power amplification and phase control are performed, it is identified that there is almost no difference in the measured values of the voltage gain. Accordingly, it may be identified that, when power amplification is not performed, even if phase control is performed, the voltage gain hardly changes.

According to embodiments of the disclosure, a device in a wireless communication system may include a first amplifier configured to amplify an input signal, and a second amplifier connected to the first amplifier and having a common gate structure of amplifying a signal output from the first amplifier, wherein the second amplifier includes a first input unit, a second input unit, a third input unit, and a fourth input unit, and two input units among the first input unit, the second input unit, the third input unit, and the fourth input unit are connected to the first amplifier.

According to an embodiment, the first amplifier may have a common source structure and include cross-coupled capacitors.

According to an embodiment, the first input unit and the second input unit may amplify the signal output from the first amplifier without inverting a phase of the signal.

According to an embodiment, the third input unit and the fourth input unit may amplify the signal output from the first amplifier while inverting a phase of the signal.

According to an embodiment, first sides of the first input unit and the second input unit may be connected to a non-inverting output unit, and second sides may be connected to an inverting output unit.

According to an embodiment, first sides of the third input unit and the fourth input unit may be connected to an inverting output unit, and second sides may be connected to a non-inverting output unit.

According to an embodiment, the first input unit, the second input unit, the third input unit, and the fourth input unit may have different voltage gains, respectively.

According to an embodiment, at least one input unit among the first input unit, the second input unit, the third input unit, and the fourth input unit may be additionally divided so as to have a different voltage.

According to an embodiment, each of the first input unit, the second input unit, the third input unit, and the fourth input unit may include a pair of transistors, and a voltage gain may be controlled using a channel width for the each pair of transistors.

According to an embodiment, the each pair of transistors is additionally divided, at least one of the divided transistors may be connected, and a voltage gain may be controlled using a channel width for the connected divided transistor.

According to embodiments of the disclosure, a method in a wireless communication system may include amplifying an input signal by using a first amplifier circuit, and amplifying the signal output from the first amplifier circuit by using a second amplifier circuit having a common gate structure, wherein the second amplifier circuit includes a first input circuit, a second input circuit, a third input circuit, and a fourth input circuit, and two input circuits among the first input circuit, the second input circuit, the third input circuit, and the fourth input circuit are connected to the first amplifier circuit.

According to an embodiment, the first amplifier circuit may have a common source structure and include cross-coupled capacitors.

According to an embodiment, the first input circuit and the second input circuit may amplify the signal output from the first amplifier circuit without inverting a phase of the signal.

According to an embodiment, the third input circuit and the fourth input circuit may amplify the signal output from the first amplifier circuit while inverting a phase of the signal.

According to an embodiment, first sides of the first input circuit and the second input circuit may be connected to a non-inverting output unit, and second sides may be connected to an inverting output unit.

According to an embodiment, first sides of the third input unit and the fourth input unit may be connected to an inverting output unit, and second sides may be connected to a non-inverting output unit.

According to an embodiment, the first input unit, the second input unit, the third input unit, and the fourth input unit may have different voltage gains, respectively.

According to an embodiment, at least one input unit among the first input unit, the second input unit, the third input unit, and the fourth input unit may be additionally divided so as to have a different voltage.

According to an embodiment, each of the first input unit, the second input unit, the third input unit, and the fourth input unit may include a pair of transistors, and a voltage gain may be controlled using a channel width for the each pair of transistors.

According to an embodiment, the each pair of transistors is additionally divided, at least one of the divided transistors may be connected, and a voltage gain may be controlled using a channel width for the connected divided transistor.

The methods according to embodiments described in the claims or the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Furthermore, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Furthermore, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, it will be apparent that various modifications and changes may be made thereto without departing from the scope of the disclosure.

The invention claimed is:

1. A device in a wireless communication system, the device comprising:

a first amplifier configured to amplify an input signal; and a second amplifier connected to the first amplifier and having a common gate structure of amplifying a signal output from the first amplifier, wherein the second amplifier comprises a first input unit, a second input unit, a third input unit, and a fourth input unit, and two input units among the first input unit, the second input unit, the third input unit, and the fourth input unit are connected to the first amplifier.

2. The device of claim 1, wherein the first amplifier has a common source structure and comprises cross-coupled capacitors.

3. The device of claim 1, wherein the first input unit and the second input unit are configured to amplify the signal output from the first amplifier without inverting a phase of the signal.

4. The device of claim 1, wherein the third input unit and the fourth input unit are configured to amplify the signal output from the first amplifier while inverting a phase of the signal.

5. The device of claim 1, wherein first sides of the first input unit and the second input unit are connected to a non-inverting output unit, and second sides are connected to an inverting output unit.

6. The device of claim 1, wherein first sides of the third input unit and the fourth input unit are connected to an inverting output unit, and second sides are connected to a non-inverting output unit.

7. The device of claim 1, wherein the first input unit, the second input unit, the third input unit, and the fourth input unit have different voltage gains, respectively.

8. The device of claim 1, wherein at least one input unit among the first input unit, the second input unit, the third input unit, and the fourth input unit is additionally divided so as to have a different voltage.

9. The device of claim 1, wherein each of the first input unit, the second input unit, the third input unit, and the fourth input unit comprises a pair of transistors, and a voltage gain is controlled using a channel widths with respect to the each pair of transistors.

10. The device of claim 9, wherein the each pair of transistors is additionally divided into transistors, at least one divided transistors is a connected transistor, and the voltage gain is controlled using the channel width with respect to the connected transistor.

11. The device of claim 1, wherein, based on a gain control, a minimum gain of 16 dB is provided from about 26 GHz to 31 GHz.

12. The device of claim 11, wherein, based on the gain control, a maximum gain of approximately 27 dB is provided from about 26 GHz to 31 GHz.

13. The device of claim 12, wherein, based on a phase control, a phase shift of one hundred and eighty degrees is provided from approximately 22 GHz to 34 GHz.

14. The device of claim 1, wherein second amplifier is configured to impose a phase shift by transistor switching.

15. The device of claim 1, wherein the second amplifier is configured to impose a specific gain by switching among a plurality of transistors, wherein each transistor is characterized by a channel width.

16. A method in a wireless communication system, the method comprising:

amplifying an input signal by using a first amplifier circuit; and amplifying the signal output from the first amplifier circuit by using a second amplifier circuit having a common gate structure, wherein the second amplifier circuit comprises a first input circuit, a second input circuit, a third input circuit, and a fourth input circuit, and two input circuits among the first input circuit, the second input circuit, the third input circuit, and the fourth input circuit are connected to the first amplifier circuit.

17. The method of claim 16, wherein the first amplifier circuit has a common source structure and comprises cross-coupled capacitors.

18. The method of claim 16, wherein the first input circuit and the second input circuit are configured to amplify the signal output from the first amplifier circuit without inverting a phase of the signal.

19. The method of claim 16, wherein the third input circuit and the fourth input circuit are configured to amplify the signal output from the first amplifier circuit while inverting a phase of the signal.

20. The method of claim 16, wherein first sides of the first input circuit and the second input circuit are connected to a non-inverting output unit, and second sides are connected to an inverting output unit.

* * * * *